(12) United States Patent
Orihara et al.

(10) Patent No.: US 10,711,493 B2
(45) Date of Patent: Jul. 14, 2020

(54) TOUCH SENSOR UNIT AND MANUFACTURING METHOD THEREOF

(71) Applicant: MITSUBA Corporation, Gunma (JP)

(72) Inventors: Yasuhiro Orihara, Gunma (JP); Naruhito Ogino, Gunma (JP); Hideki Kubota, Gunma (JP); Mitsuhiro Okada, Gunma (JP)

(73) Assignee: MITSUBA Corporation, Gunma (JP)

( * ) Notice: Subject to any disclaimer, the term of this patent is extended or adjusted under 35 U.S.C. 154(b) by 22 days.

(21) Appl. No.: 15/927,089

(22) Filed: Mar. 21, 2018

(65) Prior Publication Data

US 2018/0274269 A1 Sep. 27, 2018

(30) Foreign Application Priority Data

Mar. 24, 2017 (JP) .................................. 2017-059112

(51) Int. Cl.
*H01H 3/16* (2006.01)
*E05B 81/78* (2014.01)
(Continued)

(52) U.S. Cl.
CPC ............. *E05B 81/78* (2013.01); *E05B 81/77* (2013.01); *E05F 15/44* (2015.01); *H03K 17/965* (2013.01); *H03K 17/9645* (2013.01); *E05Y 2400/852* (2013.01); *E05Y 2400/86* (2013.01); *E05Y 2600/46* (2013.01); *E05Y 2800/205* (2013.01); *E05Y 2800/27* (2013.01); *E05Y 2800/43* (2013.01); *E05Y 2800/45* (2013.01); *E05Y 2800/678* (2013.01); *E05Y 2900/546* (2013.01); *H03K 2217/96078* (2013.01)

(58) Field of Classification Search
CPC .... H01H 3/142; H01H 3/16; H01H 2003/143; H01H 13/703; H01H 2201/032; H01H 13/704; H01H 2239/078; Y10T 29/49002; Y10T 29/49117; Y10T 29/49126; Y10T 29/49073; Y10T 29/49172; Y10T 29/49165; Y10T 29/4922; E05Y 2800/45; E05Y 2800/455; E05Y 2800/46; E05Y 2800/465
See application file for complete search history.

(56) References Cited

U.S. PATENT DOCUMENTS 7,714,595 B2 * 5/2010 Fujiwara ............... G01D 5/2405
324/663
2012/0267914 A1 * 10/2012 Thiele ........................ B60J 5/06
296/146.9

FOREIGN PATENT DOCUMENTS

JP 2014196654 10/2014

* cited by examiner

*Primary Examiner* — Ahmed M Saeed
(74) *Attorney, Agent, or Firm* — JCIPRNET

(57) ABSTRACT

The disclosure makes an insulating component and a sensor bracket to be an integrally molded article, simplifies the manufacturing process and cuts down the cost. A sensor holder and a sensor bracket made of a resin are made to be an integrally molded article, wherein the sensor holder inside which a pair of electrodes are arranged, and the sensor bracket made of a resin which holds the sensor holder and is attached to a tailgate. During an operation of filling a molten resin to a cavity, a part of the sensor holder is melted by the molten resin, and thus integrating the sensor holder and the molten resin, therefore, the two components can be structurally and firmly integrated. Accordingly, a touch sensor unit which endures long-term use can be obtained.

6 Claims, 9 Drawing Sheets

(51) Int. Cl.
*E05B 81/76* (2014.01)
*H03K 17/96* (2006.01)
*E05F 15/44* (2015.01)
*H03K 17/965* (2006.01)

TOUCH SENSOR UNIT AND MANUFACTURING METHOD THEREOF

CROSS-REFERENCE TO RELATED APPLICATIONS

This application is based on and claims priority under 35 U.S.C. § 119 to Japanese Patent Application No. 2017-059112, filed on Mar. 24, 2017, the entire content of which is incorporated herein by reference.

TECHNICAL FIELD

The disclosure relates to a touch sensor unit which is used to detect contact with a blocking and a manufacturing method thereof.

RELATED ART

Conventionally, an automatic opening/closing device arranged on a vehicle such as an automobile includes: an opening/closing body which opens or closes an opening; an electric motor which drives the opening/closing body; and an operation switch which turns the electric motor ON or OFF. An operator operates the operation switch to drive the electric motor, and the opening/closing body is driven to open or close. Besides, the automatic opening/closing device can also drive the opening/closing body according to conditions other than the operation of the operation switch.

For example, the automatic opening/closing device uses a touch sensor unit to detect whether a blocking is stuck between the opening and the opening/closing body. The touch sensor unit is fixed on the opening or the opening/closing body and detects the contact with the blocking. Based on an input of a detection signal from the touch sensor unit, the automatic opening/closing device, without depending on the operation of the operation switch, drives the opening/closing body which is driven to be closed to be opened, or stops the opening/closing body which is driven to be closed immediately.

An example of the touch sensor unit used in such automatic opening/closing device is set forth in Patent Literature 1. A foreign-object-detection sensor (touch sensor unit) set forth in Patent Literature 1 includes a hollow insulator (insulating component) inside which a plurality of electrode wires (electrodes) are arranged. The hollow insulator is adhered to a bracket (sensor bracket) by a double-faced tape, and the bracket is fixed to a periphery of the door panel.

Patent Literature 1: Japanese Laid-open No. 2014-196654

SUMMARY

However, as for the touch sensor unit set forth in above Patent Literature 1, during the assembling of the touch sensor unit, surfaces of the insulating component and the sensor bracket had to be degreased in order to obtain sufficient bonding strength. Furthermore, a release paper of the double-faced tape has to be stripped. Therefore, not only does the manufacturing process become complicated, but the manufacturing cost also increases.

The disclosure provides a touch sensor unit which forms an insulating component and a sensor bracket into an integrally molded article, simplifies the manufacturing process and cuts down the cost, and a manufacturing method thereof.

The touch sensor unit of the disclosure is a touch sensor unit, which is used to detect contact of a blocking, including: a hollow insulating component, which deforms elastically due to a stress of an external force; a plurality of electrodes, which are arranged inside the insulating component and contact with each other due to an elastic deformation of the insulating component; and a sensor bracket made of a resin, which holds the insulating component and is attached to an attachment object; wherein the insulating component and the sensor bracket is an integrally molded article.

In another aspect of the disclosure, the insulating component includes: an electrode holder which holds the plurality of electrodes, and a bracket fixture which is fixed to the sensor bracket.

In another aspect of the disclosure, a width of the electrode holder along a direction across an extending direction of the insulating component is the same as a width of the bracket fixture.

In another aspect of the disclosure, a groove into which the bracket fixture enters is arranged on the sensor bracket.

A manufacturing method of the touch sensor unit of the disclosure is a method to manufacture a touch sensor unit used to detect contact of a blocking, wherein the touch sensor unit includes: a hollow insulating component, which deforms elastically due to a stress of an external force; a plurality of electrodes, which are arranged inside the insulating component and contact with each other due to an elastic deformation of the insulating component; and a sensor bracket made of a resin, which holds the insulating component and is attached to an attachment object; wherein the manufacturing method includes: a first process, which sets the insulating component to an insulating component accommodating section of a first mold; a second process, which makes a second mold butt with the first mold, and forms a cavity which shapes the sensor bracket inside the first mold and the second mold; a third process, which fills the cavity with a molten resin, melts a part of the insulating component by the molten resin, and integrates the insulating component with the molten resin; and a fourth process, which releases the sensor bracket integrally molded with the insulating component from the first mold and the second mold.

According to the touch sensor unit of the disclosure, the insulating component and the sensor bracket made of a resin are formed to be an integrally molded article, wherein the insulating component inside which a plurality of electrodes are arranged, and the sensor bracket made of a resin which holds the insulating component and is attached to an attachment object, therefore, an operation to adhere by a double-faced tape as in a conventional way is not needed. Besides, because an adhesion of the double-faced tape is not needed, surfaces of the insulating component and the sensor bracket do not need to be degreased. Therefore, the manufacturing process can be simplified and the manufacturing cost can be cut down.

In addition, according to the manufacturing method of the touch sensor unit of the disclosure, during an operation of filling the molten resin to the cavity, a part of the insulating component is melted by the molten resin, and thus integrating the insulating component and the molten resin, therefore, the two components can be structurally and firmly integrated. Accordingly, a touch sensor unit which endures long-term use can be obtained.

DESCRIPTION OF THE EMBODIMENTS

One embodiment of the disclosure is described in detail below with reference to the drawings.

Figure 1:
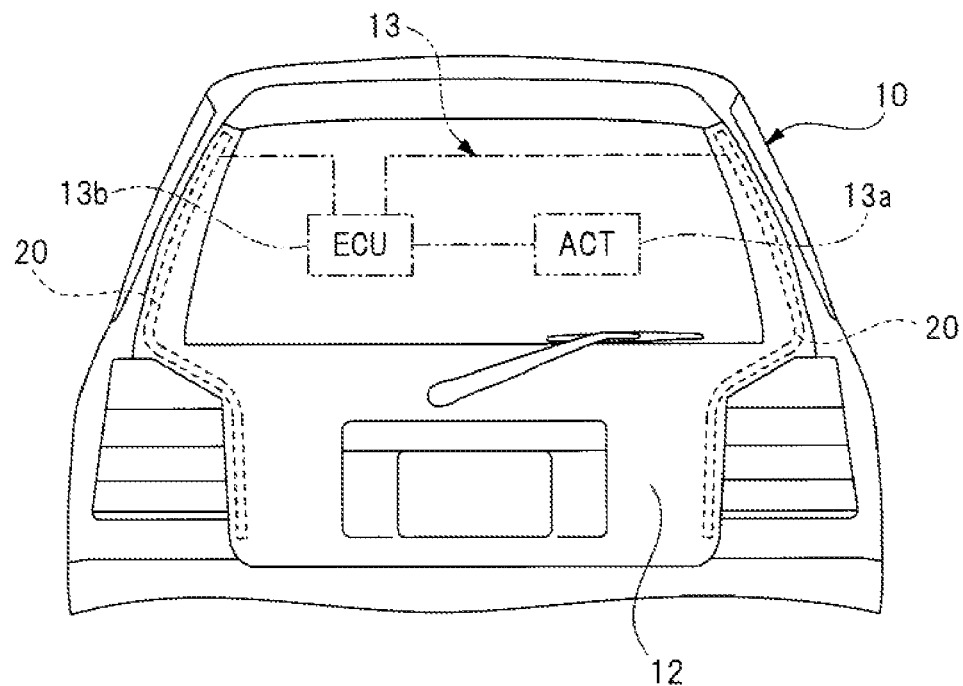
FIG. 1 is a front view of a tailgate equipped with a touch sensor unit.
Figure 2:
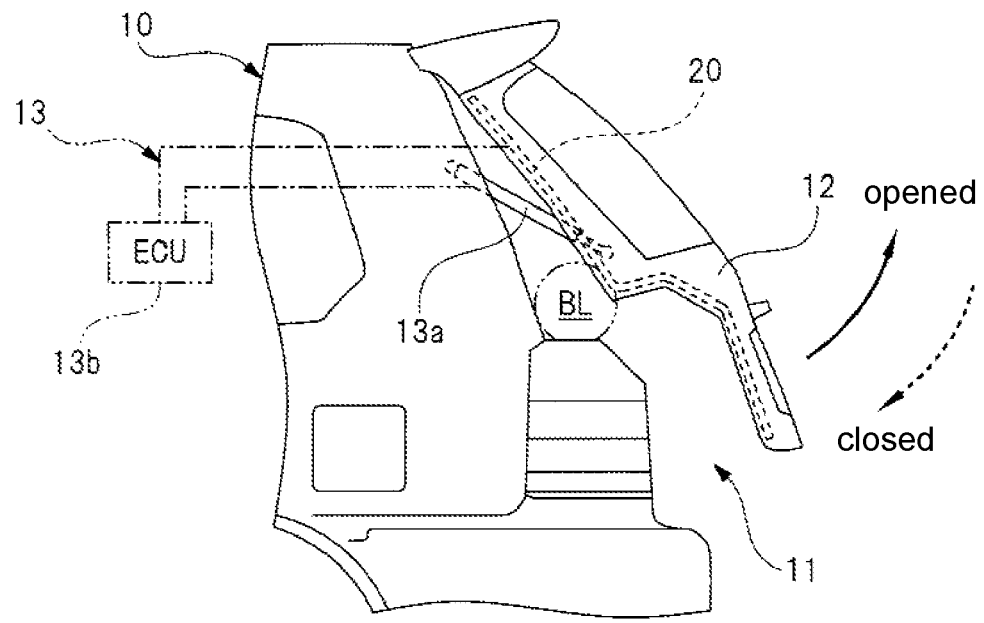
FIG. 2 is a side view obtained by observing laterally from a rear side of a vehicle in FIG. 1.
Figure 3:
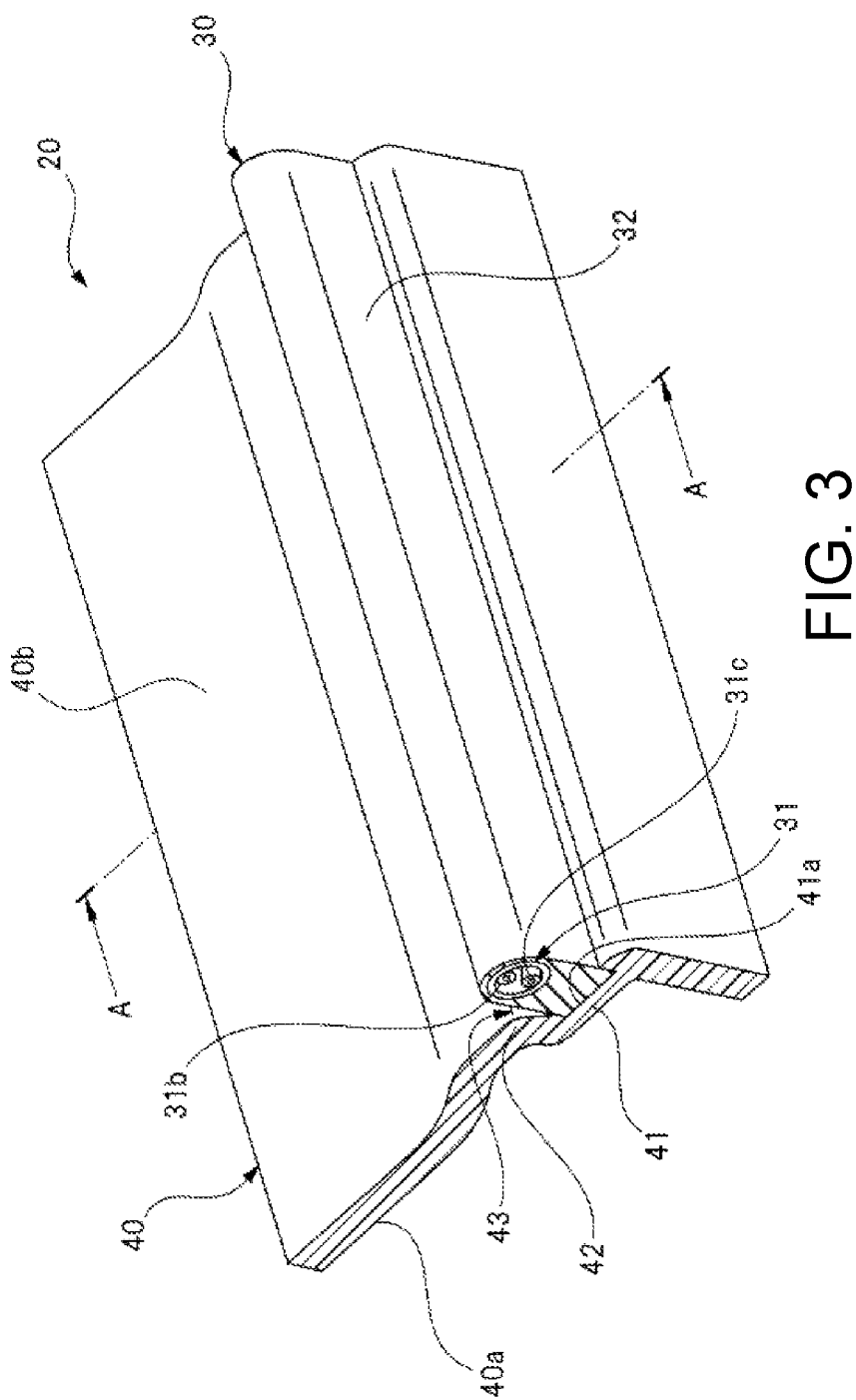
FIG. 3 is a perspective view showing a part of the touch sensor unit.
Figure 4:
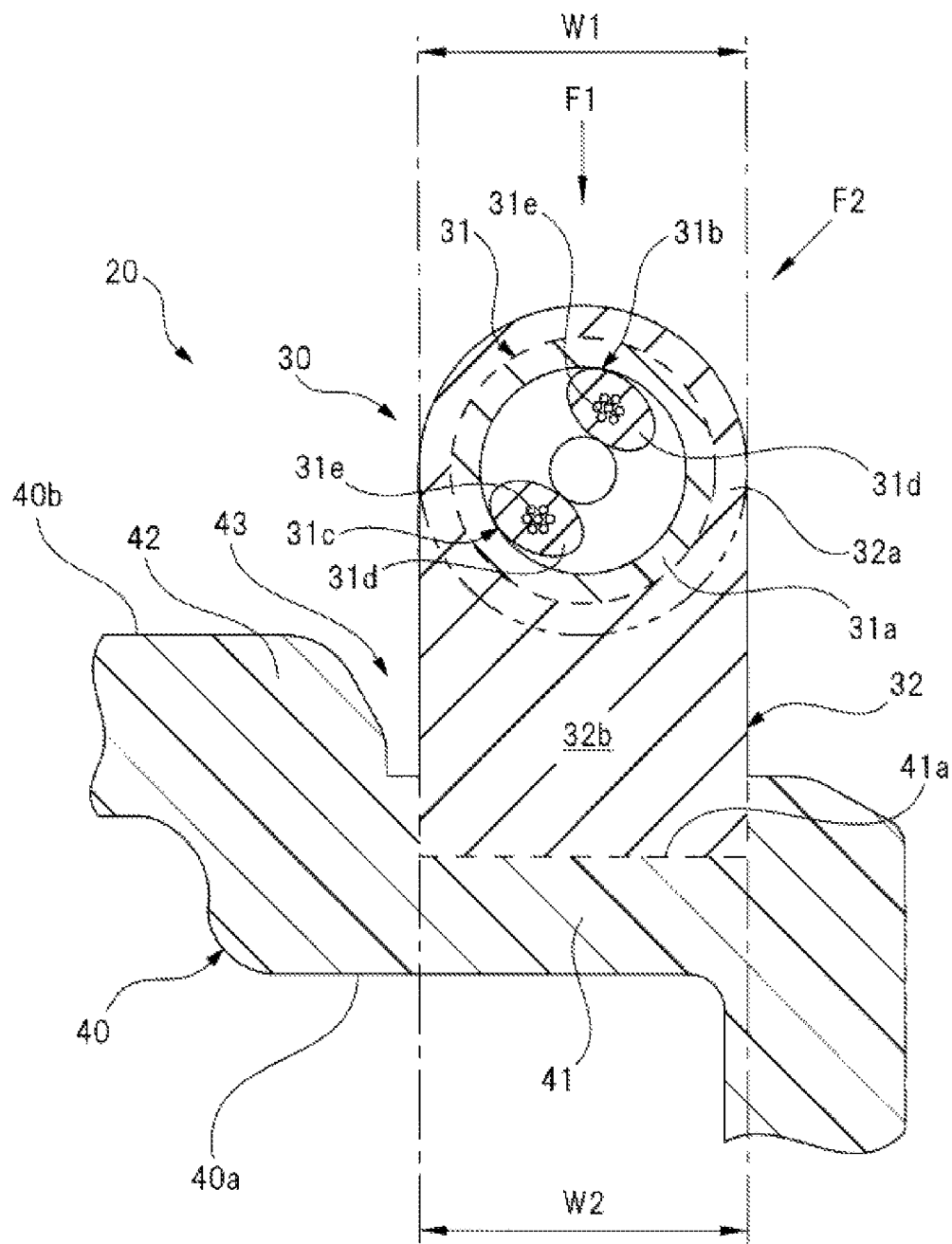
FIG. 4 is a partially enlarged sectional view along an A-A line in FIG. 3.
Figure 5:
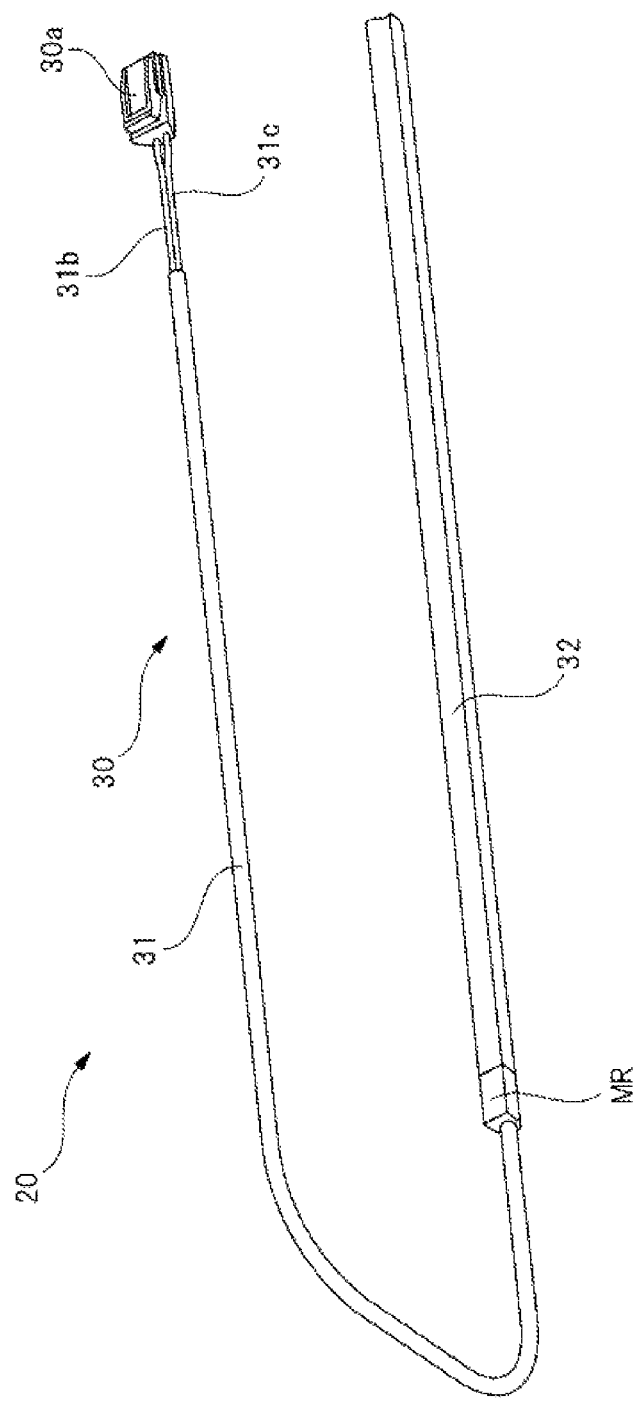
FIG. 5 is a perspective view showing a base end side of the sensor.
Figure 6:
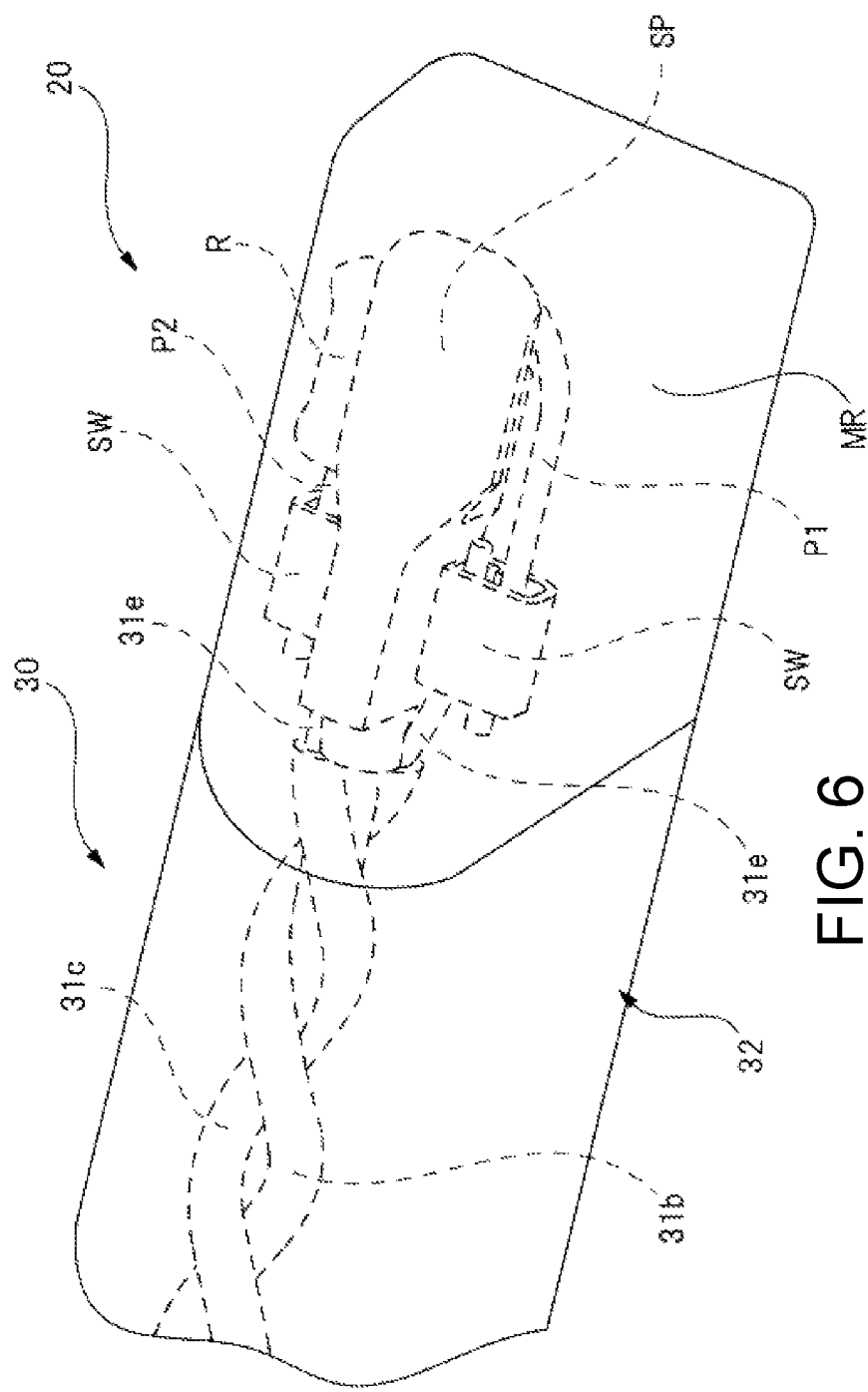
FIG. 6 is a perspective view showing a front end side of the sensor.

FIG. 1 is a front view of a tailgate equipped with a touch sensor unit. FIG. 2 is a side view obtained by observing laterally from a rear side of a vehicle in FIG. 1. FIG. 3 is a perspective view showing a part of the touch sensor unit. FIG. 4 is a partially enlarged sectional view along an A-A line in FIG. 3. FIG. 5 is a perspective view showing a base end side of the sensor. FIG. 6 is a perspective view showing a front end side of the sensor.

A vehicle 10 shown in FIG. 1 and FIG. 2 is a so-called hatchback vehicle, and an opening 11 is formed on the rear side of the vehicle 10 for large baggage to be get in and out of the vehicle interior. The opening 11 is opened and closed, as shown by the solid arrow and dashed arrow in FIG. 2, by a tailgate (opening/closing body) 12 which pivots around a hinge (not shown) arranged on a rear side of a ceiling of the vehicle 10.

Besides, a power tailgate device 13 is mounted on the vehicle 10 according to this embodiment. The power tailgate device 13 includes: an actuator 13a, which opens and closes the tailgate 12 and is equipped with a speed reducer; a controller 13b, which controls the actuator 13a based on operation signals of an operation switch (not shown); and a pair of touch sensor units 20, which detect contact of a blocking BL.

As shown in FIG. 1, the touch sensor units 20 are arranged respectively on two sides of the tailgate 12 which is an attachment object in the width direction of the vehicle (the right and left sides in the drawing). More specifically, the pair of touch sensor units 20 are disposed along a bending shape of a door frame on two sides of the tailgate 12 in the width direction of the vehicle. That is, the pair of touch sensor units 20 follow a bending shape of a door frame to be set in a bending state, and the pair of touch sensor units 20 are fixed on the tailgate 12 based on the bending state. In this way, when the blocking BL contacts with the touch sensor units 20 between the opening 11 and the tailgate 12, the touch sensor units 20 immediately deform elastically.

Each touch sensor unit 20 is electrically connected to the controller 13b, and detection signals generated during an elastic deformation of each touch sensor units 20 are input to the controller 13b. Based on the input of the detection signals from each touch sensor unit 20, the controller 13b drives the tailgate 12 which is driven to be closed to be opened without depending on the operation of the operation switch, or stops the tailgate 12 which is driven to be closed immediately. In this way, the inserting of the blocking BL is prevented in advance.

Here, as shown in FIG. 4 to FIG. 6, a pair of electrodes 31b and 31c are arranged on the touch sensor units 20, and a resistor R is electrically connected to the front end side (the right side in FIG. 6) of the touch sensor units 20. In this way, in a state where the touch sensor units 20 do not deform elastically, the pair of electrodes 31b and 31c does not contact with each other, and the resistance value of the resistor R is input to the controller 13b. That is, in the case when the resistance value of the resistor R is input, the controller 13b determines that no blocking BL is inserted and continues driving the tailgate 12 to close.

On the contrary, when the blocking BL contacts with the touch sensor units 20 and the touch sensor units 20 deform elastically, the pair of electrodes 31b and 31c contact with each other and are short circuited. Then, a resistance value not via the resistor R is input to the controller 13b. In this way, the controller 13b detects the change of the resistance value and, triggered by the change of the resistance value, implements the control which drives the tailgate 12 to be opened or stops the tailgate 12 immediately.

As shown in FIG. 3 to FIG. 6, the touch sensor units 20 include: a sensor 30 which is formed to a shape of a long string; and a sensor bracket 40 used to fix the sensor 30 to the tailgate 12 (see FIG. 1 and FIG. 2).

As shown in FIG. 4, the sensor 30 includes a sensor body 31 and a sensor holder 32 which holds the sensor body 31. Besides, as shown in FIG. 5, on a base end side of the sensor 30, base end sides of the pair of electrodes 31b and 31c are disposed, and on the base end of each electrode 31b and 31c, a male connector 30a which is set on a female connector (not shown) of the controller 13b (see FIG. 1 and FIG. 2) is arranged. In addition, the boundary of the sensor body 31 and the sensor holder 32 is protected by a molding resin MR.

As shown in FIG. 4, the sensor body 31 includes a hollow insulating tube 31a which contains an insulating rubber material with flexibility and so on. The insulating tube 31a deforms elastically due to a stress of an external force, and the pair of electrodes 31b and 31c are spirally held on an inner side (interior) in a diameter direction of the insulating tube 31a. The electrodes 31b and 31c include a conductive tube 31d which contains a conductive rubber with flexibility and so on, and a conductive wire 31e formed by bundling several copper strings is arranged inside the conductive tube 31d.

By spirally fixing each electrode 31b and 31c to the inner side in the diameter direction of the insulating tube 31a, even if the blocking BL (see FIG. 2) contacts with any position along a circumferential direction of the sensor body 31 and the insulating tube 31a deforms elastically, the electrodes 31b and 31c contact with each other under about the same condition (pressing force) and are short circuited. That is, the variation in detection sensitivity in accordance with the position of the insulating tube 31a is kept to a minimum.

As shown in FIG. 4, the sensor holder 32 is formed in an elongated shape by extruding and molding an insulating rubber material with flexibility. More specifically, the sensor body 31 formed in advance in other manufacturing process is extruded from a mold together with a rubber material (not shown) softened by heating, by which the sensor holder 32 equipped with the sensor body 31 is formed. In this way, a part of the surface of the insulating tube 31a is melted by the high-temperature rubber material, the sensor holder 32 is structurally integrated with a part of the insulating tube 31a and the two components are tightly fixed to each other. Moreover, the operation of mounting the sensor body 31 to the sensor holder 32 after the formation of the sensor holder 32 is not needed, therefore the assembling procedure can also be simplified.

Here, in order to show that the insulating tube 31a and the sensor holder 32 are melted and combined with each other to be structurally integrated, in FIG. 4, the boundary section of the insulating tube 31a and the sensor holder 32 is represented by a "dashed line". In addition, the insulating tube 31a and the sensor holder 32 constitute the insulating component in the disclosure.

The sensor holder 32 includes a hollow sensor section (electrode holder) 32a which accommodates the sensor body 31 inside. That is, the sensor section 32a holds the pair of electrodes 31b and 31c. And the cross section of the sensor section 32a along a direction across the extending direction of the sensor holder 32 is approximately circle-shaped. Besides, the sensor holder 32 includes a bracket fixture 32b which is fixed to a groove 41a of the sensor bracket 40. And the cross section of the bracket fixture 32b along the direction across the extending direction of the sensor holder 32 is approximately quadrangular. In addition, the two-dot chain line in FIG. 4 represents the boundary section of the sensor section 32a and the bracket fixture 32b.

A width W1 (diameter size) of the sensor section 32a along a direction across the longitudinal direction of the sensor holder 32 is set to the same width as a width W2 of the bracket fixture 32b along the direction across the longitudinal direction of the sensor holder 32 (W1=W2). In this way, the shape of the sensor holder 32 can be simplified, and the shape of the mold which is used in the extrusion formation of the sensor holder 32 can also be simplified. Accordingly, the cost can be cut down.

Besides, as shown in FIG. 4, the shape of the cross section of the sensor holder 32 is a straight shape (a vertically long shape) without a step. Therefore, during the formation of the sensor bracket 40, the sensor holder 32 is easily set to a sensor accommodating section 51c (see FIG. 7) of a lower mold 51. Moreover, during the formation of the sensor bracket 40, the sensor holder 32 (sensor 30) is integrated with the sensor bracket 40 by insert molding.

Here, a part of the sensor holder 32 on the boundary section with the sensor bracket 40 is melted by a molten resin MP (see FIG. 9) which shapes the sensor bracket 40, and is integrated structurally with each other. That is, the sensor holder 32 and the sensor bracket 40 becomes an integrally molded article. Therefore, in FIG. 4, the boundary section of the sensor holder 32 and the sensor bracket 40 is also represented by a "dashed line". In addition, the manufacture procedure of the sensor bracket 40 is described in detail below.

The wall thickness of the sensor section 32a is approximately the same as the wall thickness of the insulating tube 31a. Accordingly, the sensor section 32a is easy to deform elastically due to the stress of the external force. Therefore, the electrodes 31b and 31c held on the sensor section 32a via the insulating tube 31a easily contact with each other due to the elastic deformation of the sensor section 32a, and sufficient detection performance of the sensor body 31 is ensured.

Here, the bracket fixture 32b situated near the bracket body 41 in relation to the sensor section 32a can also easily deform elastically as the sensor section 32a does. In this way, under any of a load F1 applied directly from the upper side in FIG. 4 or a load F2 applied from the diagonally upward side in FIG. 4, the electrodes 31b and 31c can also easily contact with each other. Therefore, sufficient detection performance of the sensor body 31 can also be ensured in this way.

As shown in FIG. 6, on the front end side of the sensor 30, a separator SP including an insulator, one resistor R and two swaged components SW are arranged. And the separator SP, resistor R and each swaged component SW are buried inside the molding resin MR by insert molding.

On two ends of the resistor R, a longer connecting part P1 and a shorter connecting part P2 are arranged. And by folding the longer connecting part P1 back for 180° in relation to the shorter connecting part P2, the longer connecting part P1 and the shorter connecting part P2 face the conductive wire 31e of the electrodes 31b and 31c respectively. The longer connecting part P1 and the shorter connecting part P2 are electrically connected with the conductive wire 31e of the electrodes 31b and 31c respectively via each swaged component SW. In this way, the ends of the electrodes 31b and 31c are electrically connected with each other via the resistor R.

In addition, each swaged component SW is swaged by swaging jigs (not shown) such as a lineman's plier, and the resistor R is electrically connected with the respective conductive wire 31e of the electrodes 31b and 31c firmly. Besides, each swaged component SW are disposed on two sides of the separator SP to be centrally symmetric in relation to the separator SP, and the parts of the separator SP are prevented from being short circuited with each other.

As shown in FIG. 3 and FIG. 4, the sensor bracket 40 includes resin material such as plastic, and is an approximately plate shape equipped with a plurality of bending sections. That is, the hardness of the sensor bracket 40 is set to be higher than the hardness of the sensor holder 32. The sensor bracket 40 includes: a back surface section 40a on the side where the tailgate 12 (see FIG. 1 and FIG. 2) is fixed, and a front surface section 40b on the side where the sensor 30 is fixed. In addition, the sensor bracket 40 is attached to a predetermined position of the tailgate 12 by a fixed nail (not shown) formed on the back surface section 40a or a double-faced tape (not shown) adhered on the back surface section 40a.

On the sensor bracket 40, the bracket body 41 on which the sensor 30 is fixed is arranged. Besides, on the front surface section 40b side of the bracket body 41, the groove 41a into which the bracket fixture 32b enters is arranged. And the groove 41a of the bracket body 41 extends along the bending shape of the door frame of the tailgate 12 in the state that the sensor bracket 40 is fixed to the tailgate 12 (see FIG. 1 and FIG. 2).

A protruding section 42 is integrally arranged on the side (the left side in FIG. 4) along the width direction of the bracket body 41. The protruding section 42 protrudes toward the side (the front surface section 40b side) where the sensor 30 is disposed. The protruding section 42 is disposed in the interior of the vehicle which is on the two sides centering on the bracket fixture 32b of the sensor 30. The height of the protruding section 42 is set to be smaller than the protruding height of the sensor 30. In this way, before the blocking BL (see FIG. 2) contacts with the protruding section 42, the electrodes 31b and 31c of the sensor 30 can be definitely short circuited.

Besides, a gap portion 43 is arranged between the protruding section 42 and the bracket fixture 32b. When the sensor holder 32 deforms elastically due to the contact of the blocking BL, the elastically deformed part of the sensor holder 32 (the sensor section 32a and the bracket fixture 32b) enters into the gap portion 43. That is, the gap portion 43 functions as a clearance when the sensor holder 32 deforms elastically. In this way, the sensor holder 32 is protected from breaking and so on.

Next, the manufacturing method of the touch sensor unit 20 formed in the above way is described in detail with reference to the drawings.

Figure 7:
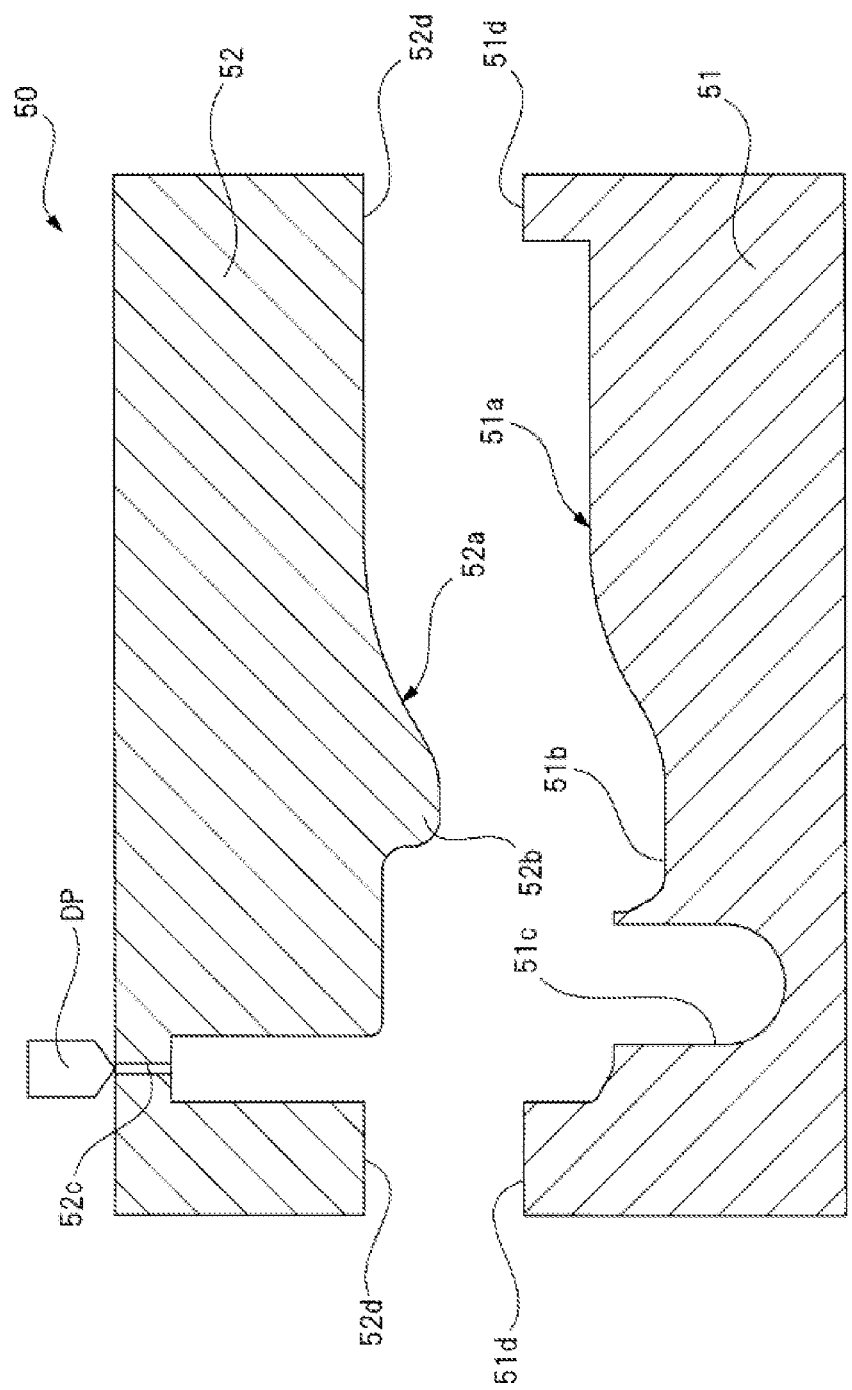
FIG. 7 is a sectional view showing upper and lower molds used for manufacturing the touch sensor unit.
Figure 8:
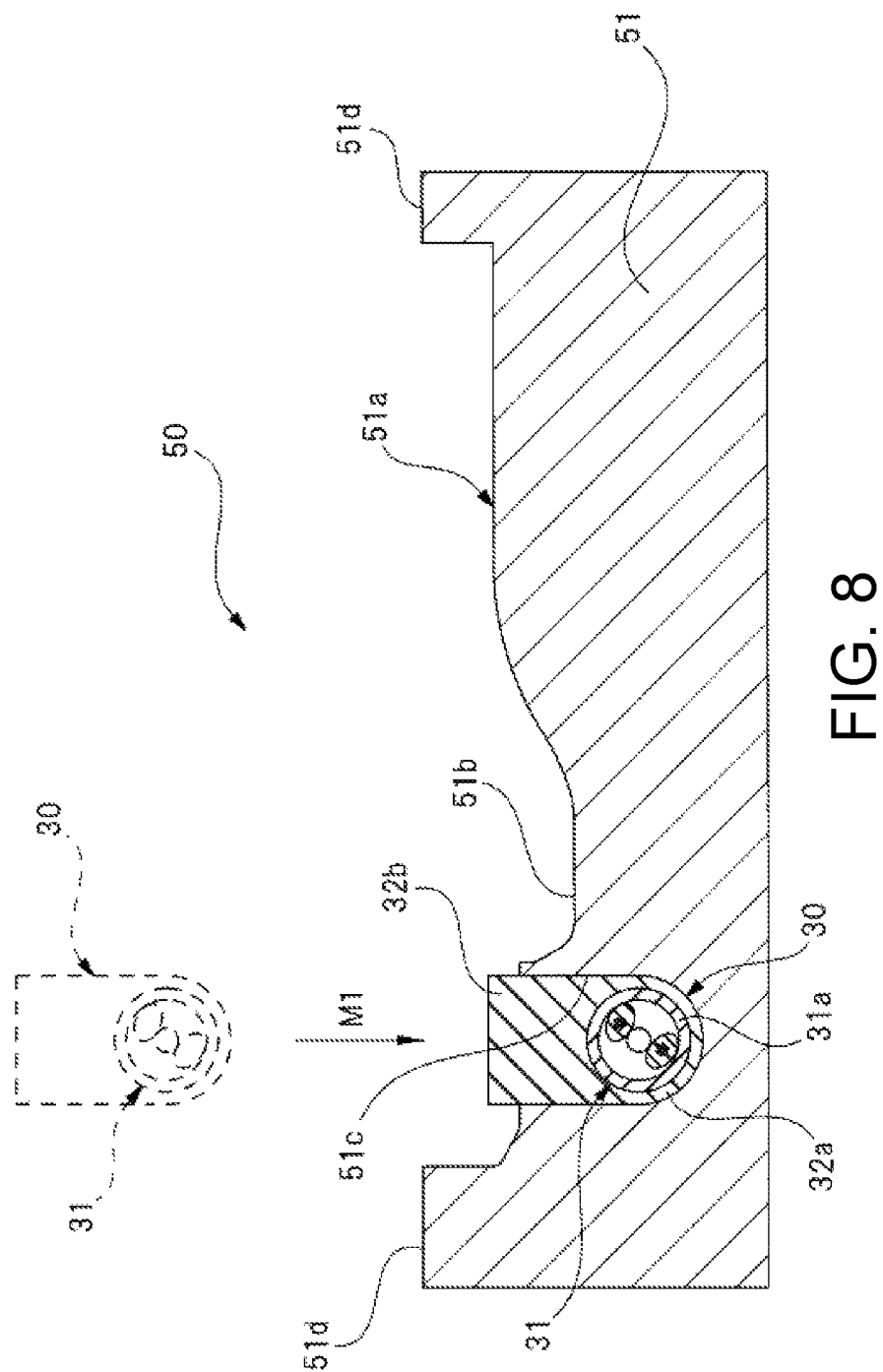
FIG. 8 is an illustrative drawing illustrating a "sensor setting process" which sets the sensor to the lower mold.
Figure 9:
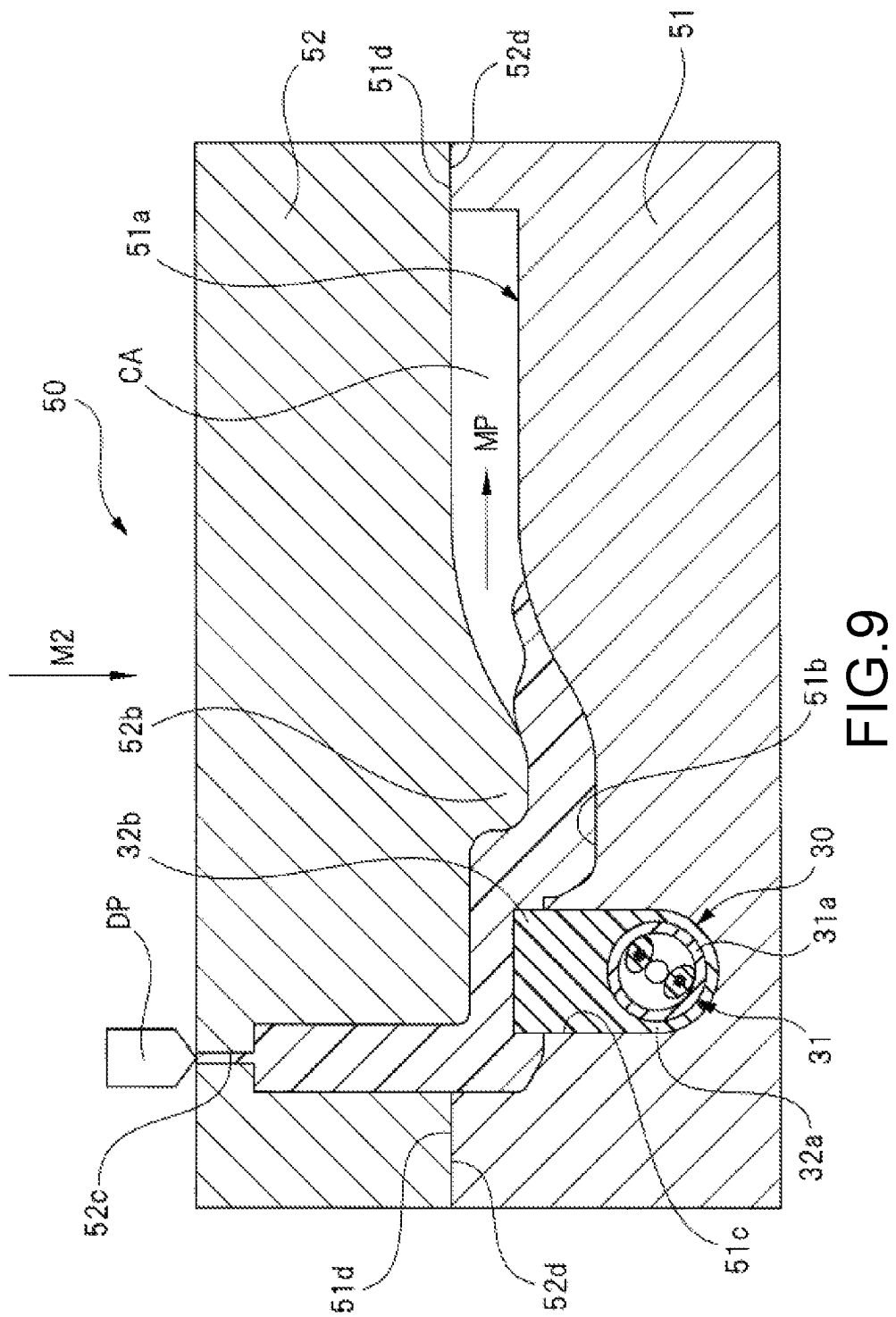
FIG. 9 is an illustrative drawing illustrating a "butting process" which butts the upper mold with the lower mold and a "molten resin filling process" which fills a cavity with a molten resin.
Figure 10:
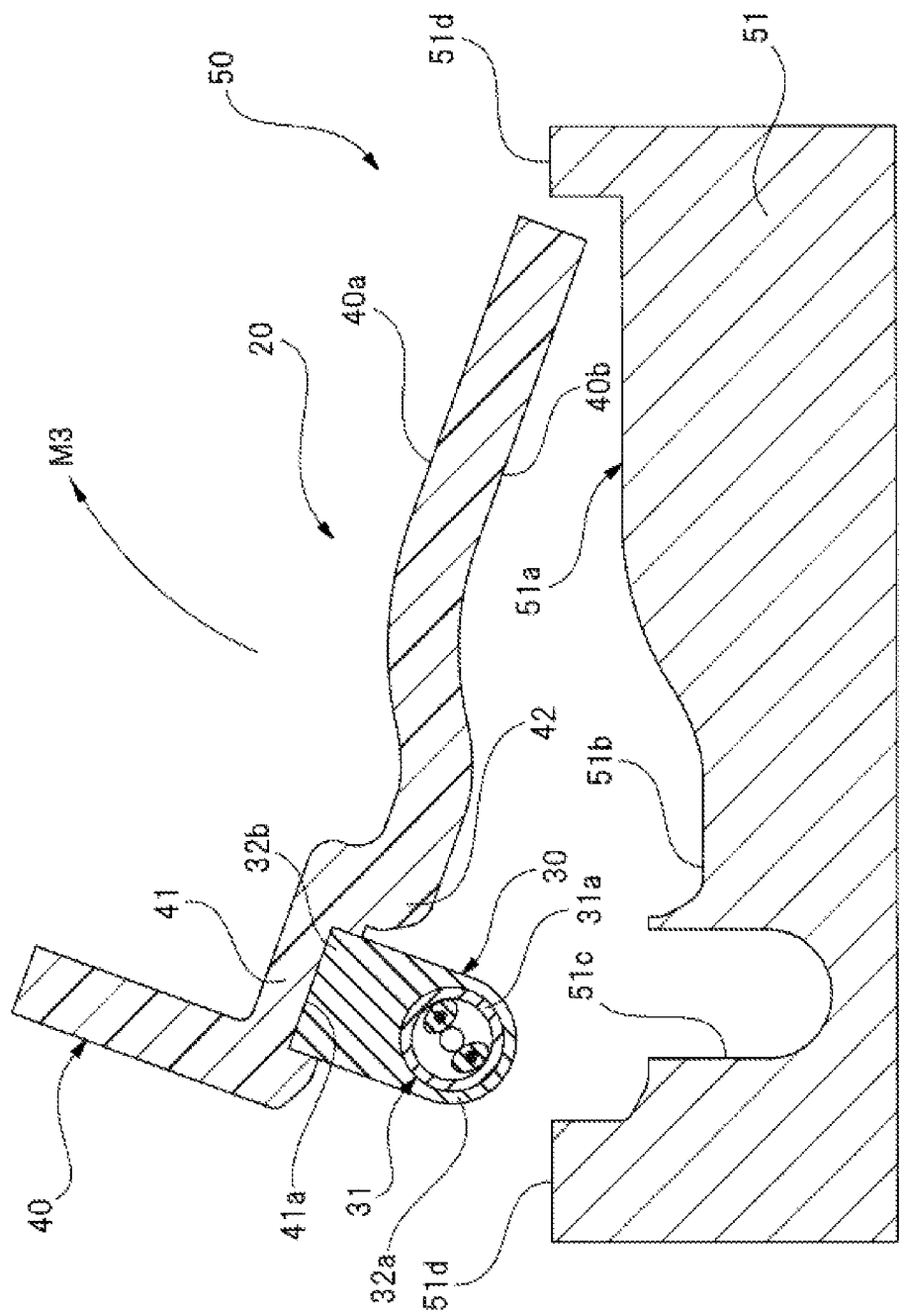
FIG. 10 is an illustrative drawing illustrating a "releasing process" which releases a completed touch sensor unit from the upper and lower molds.

FIG. 7 is a sectional view showing upper and lower molds used for manufacturing the touch sensor unit. FIG. 8 is an illustrative drawing illustrating a "sensor setting process" which sets the sensor to the lower mold. FIG. 9 is an illustrative drawing illustrating a "butting process" which butts the upper mold with the lower mold and a "molten resin filling process" which fills a cavity with a molten resin. FIG. 10 is an illustrative drawing illustrating a "releasing process" which releases a completed touch sensor unit from the upper and lower molds.

As mentioned above, the touch sensor units 20 includes the sensor 30 and the sensor bracket 40, and the sensor 30 is integrated with the sensor bracket 40 by insert molding during the formation of the sensor bracket 40. First, structures of the upper and lower molds used during the insert molding of the touch sensor units 20 are described.

As shown in FIG. 7, an insert molding device 50 which forms the touch sensor unit 20 includes a lower mold (first mold) 51 which is fixed on a base (not shown) and serves as a fixing mold. On the lower mold 51, a back surface section formation concave 51a, which forms the back surface section 40a (see FIG. 4) of the sensor bracket 40, is arranged. On the back surface section formation concave 51a, a protruding section formation concave 51b which forms the protruding section 42 (see FIG. 4) of the sensor bracket 40, and a sensor accommodating section (insulating component accommodating section) 51c which accommodates the sensor 30 are arranged. Moreover, a top end face of the lower mold 51, which is disposed on the uppermost side in the drawing, becomes a butting face 51d which butts with a butting face 52d of the upper mold 52.

On the other hand, the upper mold (second mold) 52 becomes a movable mold which is moved up and down by a hydraulically-driven mechanism (not shown), for example. On the upper mold 52, a front surface section formation convex 52a which forms the front surface section 40b (see FIG. 4) of the sensor bracket 40 is arranged. On the front surface section formation convex 52a, a protruding section formation convex 52b which forms the protruding section 42 (see FIG. 4) of the sensor bracket 40 is arranged. Besides, a gate path 52c used to supply the molten resin MP is formed in the upper mold 52, and the molten resin MP is provided in a cavity CA (see FIG. 9) formed by butting the upper mold 52 and the lower mold 51. In addition, a bottom end face of the upper mold 52, which is disposed on the lowermost side in the drawing, becomes a butting face 52d which butts with a butting face 51d of the lower mold 51.

On the entrance side (the upper side in the drawing) of the gate path 52c of the upper mold 52, a dispenser DP supplying the molten resin MP is disposed, and the heated and melted molten resin MP is supplied from the dispenser DP to the gate path 52c under a predetermined pressure. In this way, the molten resin MP is evenly supplied to every corner inside the cavity CA which is formed by butting the upper mold 52 and the lower mold 51.

[Sensor Setting Process (First Process)]

First, as shown in FIG. 8, prepare the sensor 30 which is formed in advance by another manufacturing process. Then, as shown by an arrow M1 in the drawing, set the sensor 30 (the sensor holder 32) to the sensor accommodating section 51c of the lower mold 51. At this time, the sensor section 32a side of the sensor 30 is made to face the bottom side (the lower side in the drawing) of the sensor accommodating section 51c. In addition, the operation of setting the sensor 30 to the sensor accommodating section 51c may be manually done by the operator or be done automatically by a robot arm.

Here, in the state where the sensor 30 is set to the sensor accommodating section 51c (the state shown in FIG. 8), the bracket fixture 32b of the sensor 30 comes into a state of protruding a little from the sensor accommodating section 51c. In this way, even if the lower mold 51 is raised to high temperature, the operator can also definitely set the sensor 30 to the sensor accommodating section 51c without contacting with the lower mold 51.

In this way, the sensor setting process is completed.

[Butting Process (Second Process)]

Next, drive the hydraulically-driven mechanism to descend the upper mold 52 as shown by an arrow M2 in FIG. 9. In this way, the butting face 52d of the upper mold 52 is butted with the butting face 51d of the lower mold 51. Then, inside the upper mold 52 and the lower mold 51 butted with each other, the cavity CA which shapes the sensor bracket 40 (see FIG. 3) is formed.

In this way, the butting process is completed.

[Molten Resin Filling Process (Third Process)]

Next, the dispenser DP is driven. In this way, the heated and melted molten resin MP is supplied from the dispenser DP to the interior of the gate path 52c under a predetermined pressure. After that, by driving the dispenser DP continuously, the molten resin MP is filled inside the cavity CA as shown by the arrow in FIG. 9. At this time, because the molten resin MP is at high temperature, a part of the bracket fixture 32b which protrudes a little toward the inside of the cavity CA is melted. In this way, the molten resin MP which becomes the sensor bracket 40 later and the bracket fixture 32b of the sensor 30 are structurally integrated. Accordingly, the sensor 30 and the sensor bracket 40 are firmly fixed to each other, the stripping between the two components is definitely prevented, and the detection accuracy of the sensor 30 can be maintained for a long time.

In addition, among the components constituting the sensor 30, the sensor body 31 which has the most important function is disposed on the bottom side of the sensor accommodating section 51c. Therefore, the heat of the molten resin MP is hard to be transferred to the sensor body 31. Accordingly, the insulating tube 31a of the sensor body 31 and the like are prevented from melting or deforming under heat.

In this way, the molten resin filling process is completed.

[Releasing Process (Fourth Process)]

Next, by forcibly cooling the upper mold 52 and the lower mold 51 with cooling water and so on (not shown), the molten resin MP is hardened. In this way, the touch sensor units 20 can be quickly and efficiently released from the upper mold 52 and the lower mold 51. Here, the method for forcibly cooling is not illustrated in detail, and a method which feeds the cooling water and so on to the cooling water path (not shown) arranged on the upper mold 52 and the lower mold 51 is adopted.

Next, the hydraulically-driven mechanism not shown is driven to ascend the upper mold 52 in relation to the lower mold 51. In this way, the upper mold 52 is released from the touch sensor units 20 which is completed by integrally molding the sensor 30 and the sensor bracket 40. After that, by driving a releasing pin (not shown) arranged on the lower mold 51, the completed touch sensor units 20 is also released from the lower mold 51 as shown by an arrow M3 in FIG. 10.

In this way, the releasing process is completed and the manufacture of the touch sensor units 20 is ended.

As elaborated above, according to this embodiment, because the sensor holder 32 and the sensor bracket 40 made of a resin are made to be an integrally molded article, the operation to adhere by a double-faced tape as in a conventional way is not needed, wherein the sensor holder 32 inside which the pair of electrodes 31b and 31c are arranged, and the sensor bracket 40 made of a resin which holds the sensor holder 32 and is attached to the tailgate 12. Besides, because the adhesion of the double-faced tape is not needed, the surfaces of the sensor holder 32 and the sensor bracket 40 do not need to be degreased. Therefore, the manufacturing process can be simplified and the manufacturing cost can be cut down.

In addition, according to this embodiment, during an operation of filling the molten resin MP to the cavity CA, a part of the sensor holder 32 is melted by the molten resin MP, and thus integrating the sensor holder 32 and the molten resin MP, therefore, the two components can be structurally and firmly integrated. Accordingly, the touch sensor unit 20 which endures long-term use can be obtained.

Furthermore, according to this embodiment, the sensor holder 32 includes the sensor section 32a which holds the pair of electrodes 31b and 31c, and the bracket fixture 32b which is fixed to the sensor bracket 40, therefore, the sensor section 32a can be disposed away from the sensor bracket 40 by the bracket fixture 32b. In this way, the sensitivity of the sensor 30 can be maintained good. Besides, when the blocking BL makes contact and the sensor 30 is subject to the stress, the load is distributed to the thick bracket fixture 32b and the thin sensor section 32a respectively, thus, stress can be prevented from concentrating on the thin sensor section 32a and the thin sensor section 32a can be protected.

Besides, according to this embodiment, because the width W1 of the sensor section 32a along the direction across the longitudinal direction of the sensor holder 32 is the same width as the width W2 of the bracket fixture 32b (W1=W2), the shape of the mold used for the extrusion formation of the sensor holder 32 can be simplified. Besides, during the formation of the sensor bracket 40, the sensor holder 32 can be easily set to the sensor accommodating section 51c of the lower mold 51.

Furthermore, according to this embodiment, because the groove 41a into which the bracket fixture 32b enters is arranged on the sensor bracket 40, the sensor holder 32 and the sensor bracket 40 can be integrated more firmly. Accordingly, the touch sensor units 20 can endure long-term use.

The disclosure is not limited to the above embodiment, and can be modified in various ways without departing from the spirit of the disclosure. For example, in the above embodiment, a pair of electrodes 31b and 31c are spirally fixed inside the insulating tube 31a, but the disclosure is not limited to this situation, and four, six or other number of electrodes may be arranged spirally or in parallel in accordance with the thickness of the electrodes or the necessary detection performance and the like.

Besides, in the above embodiment, the case in which the touch sensor units 20 are fixed to the tailgate 12 of the vehicle 10 is shown, but the disclosure is not limited to this case, and can also be applied to a sunroof device, a slide door device, or a power window device and so on which is mounted on a vehicle. To sum it up, the disclosure can be applied to an opening/closing device which opens and closes automatically. For example, the disclosure is not limited to the application in the vehicle 10 and can also be applied to an automatic door device which is used to open and close the entrance of a building.

Besides, as long as the disclosure can be achieved, the material, shape, size, number, position and so on of the structural elements of the above embodiment can be arbitrarily set, without being limited to the above embodiment.

What is claimed is:

1. A touch sensor unit used to detect contact of a blocking, comprising: a hollow insulating component, which deforms elastically due to a stress of an external force; a plurality of electrodes, which are arranged inside the insulating component and contact with each other due to an elastic deformation of the insulating component; and a sensor bracket made of a resin, which holds the insulating component and is attached to an attachment object, wherein the insulating component comprises: an electrode holder, which holds the plurality of electrodes; and a bracket fixture, which is fixed to the sensor bracket, wherein the insulating component and the sensor bracket is an integrally molded article, and a hardness of the sensor bracket is set to be higher than a hardness of the insulating component, wherein the electrode holder is disposed away from the sensor bracket by the bracket fixture; further comprising: a protruding section, being integrally arranged on a side along a width direction of a bracket body of the sensor bracket, wherein the protruding section protrudes toward a side where a sensor is disposed, and the sensor comprises the insulating component and the plurality of electrodes, a height of the protruding section is set to be smaller than a protruding height of the sensor.

2. The touch sensor unit according to claim 1, wherein a width of the electrode holder along a direction across an extending direction of the insulating component is the same as a width of the bracket fixture.

3. The touch sensor unit according to claim 1, wherein a groove into which the bracket fixture enters is arranged on the sensor bracket.

4. The touch sensor unit according to claim 2, wherein a groove into which the bracket fixture enters is arranged on the sensor bracket.

5. A manufacturing method of a touch sensor unit used to detect contact of a blocking, wherein
the touch sensor unit comprises:
a hollow insulating component, which deforms elastically due to a stress of an external force;
a plurality of electrodes, which are arranged inside the insulating component and contact with each other due to an elastic deformation of the insulating component; and
a sensor bracket made of a resin, which holds the insulating component and is attached to an attachment object;
wherein the manufacturing method comprises:
a first process, which sets the insulating component to an insulating component accommodating section of a first mold;
a second process, which makes a second mold butt with the first mold, and forms a cavity which shapes the sensor bracket inside the first mold and the second mold;
a third process, which fills the cavity with a molten resin, melts a part of the insulating component by the molten resin, and integrates the insulating component with the molten resin; and a fourth process, which releases the sensor bracket integrally molded with the insulating component from the first mold and the second mold.

6. The touch sensor unit according to claim 3, wherein the bracket fixture is fixed to the groove of the sensor bracket.

* * * * *